(12) United States Patent
Choi

(10) Patent No.: US 12,254,804 B2
(45) Date of Patent: Mar. 18, 2025

(54) DISPLAY APPARATUS AND DRIVING POWER CONTROL METHOD THEREOF

(71) Applicant: LG Display Co., Ltd., Seoul (KR)

(72) Inventor: Jae Yi Choi, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 18/491,115

(22) Filed: Oct. 20, 2023

(65) Prior Publication Data
US 2024/0257686 A1 Aug. 1, 2024

(30) Foreign Application Priority Data

Jan. 27, 2023 (KR) .......................... 10-2023-0010893

(51) Int. Cl.
*G09G 3/20* (2006.01)

(52) U.S. Cl.
CPC ....... *G09G 3/20* (2013.01); *G09G 2300/0452* (2013.01); *G09G 2300/0819* (2013.01); *G09G 2310/0286* (2013.01); *G09G 2330/021* (2013.01)

(58) Field of Classification Search
CPC ............ G09G 3/20; G09G 2300/0452; G09G 2300/0819; G09G 2310/0286; G09G 2330/021; G09G 3/3266; G09G 2310/0264; G09G 2320/043; G09G 2330/028; G09G 3/32; G09G 3/006; G09G 2310/0267; G09G 2330/12; H01L 27/1251; H01L 27/1255; H01L 27/1225
See application file for complete search history.

(56) References Cited

U.S. PATENT DOCUMENTS

| 11,538,387 | B1* | 12/2022 | Lee .......................... G09G 3/20 |
| 2002/0175662 | A1 | 11/2002 | Sakurai et al. |
| 2011/0141098 | A1* | 6/2011 | Yaguma ............... G09G 3/3696 345/212 |
| 2014/0085285 | A1* | 3/2014 | Kim ....................... G11C 19/28 377/67 |

(Continued)

FOREIGN PATENT DOCUMENTS

KR 10-2019-0047298 A 5/2019

OTHER PUBLICATIONS

Intellectual Property Office of the United Kingdom, Combined Search and Examination Report, United Kingdom Patent Application No. GB2316628.3, May 3, 2024, nine pages.

*Primary Examiner* — Ibrahim A Khan
(74) *Attorney, Agent, or Firm* — Fenwick & West LLP

(57) ABSTRACT

A display apparatus includes a display panel; a gate driver configured to drive gate lines of the display panel, the gate driver including gate stages that are connected to a power line that supplies an output voltage to the gate stages; a comparator circuit coupled with the gate driver through a feedback line, the comparator circuit configured to compare a first divided voltage of a first node of the comparator circuit that is based on a feedback current in the feedback line and a second divided voltage of a second node of the comparator circuit that based on a reference voltage, and supply the output voltage to a third node of the comparator circuit that is connected to the power line, the output voltage based on the comparison between the first divided voltage and the second divided voltage.

18 Claims, 7 Drawing Sheets

(56) References Cited

U.S. PATENT DOCUMENTS

| | | | |
|---|---|---|---|
| 2016/0011612 A1* | 1/2016 | Park | G09G 3/3233 |
| | | | 323/280 |
| 2016/0266590 A1* | 9/2016 | Ura | G05F 1/10 |
| 2018/0096645 A1* | 4/2018 | Lee | G09G 3/20 |
| 2018/0315369 A1* | 11/2018 | Pyun | G09G 3/3677 |
| 2019/0088183 A1* | 3/2019 | Jeong | H03F 3/303 |
| 2021/0011505 A1* | 1/2021 | Chien | G05F 1/575 |
| 2022/0083085 A1* | 3/2022 | Lee | G05F 1/10 |
| 2022/0208108 A1 | 6/2022 | Lee et al. | |
| 2023/0005429 A1* | 1/2023 | Jang | G06F 1/26 |
| 2023/0252926 A1* | 8/2023 | Hong | H02M 1/0009 |
| | | | 345/211 |

* cited by examiner

VN2 of PCC

VL

DISPLAY APPARATUS AND DRIVING POWER CONTROL METHOD THEREOF

CROSS-REFERENCE TO RELATED APPLICATION

This application claims the benefit and priority of the Republic of Korea Patent Application No. 10-2023-0010893 filed on Jan. 27, 2023, which is hereby incorporated by reference in its entirety.

TECHNICAL FIELD

The present disclosure relates to a display apparatus and a driving power control method thereof.

DISCUSSION OF THE RELATED ART

Display apparatuses include a display panel and a gate driver for driving gate lines of the display panel. The gate driver may be formed in a non-display area of the display panel through a thin film transistor (TFT) process so as to reduce the manufacturing cost.

The gate driver needs a driving power for a normal operation. The driving power is set to an initial voltage in releasing of products, and a distribution range of a setting value is wide due to a TFT process distribution of the gate driver and a printed circuit board (PCB) resistance for setting of the initial voltage.

When the initial voltage of the driving power is set to be high, the reliability and lifetime of the gate driver may be reduced. Particularly, when a setting value for the initial voltage of the driving power is outside a predetermined target voltage range, a defect occurs, and due to this, a yield rate of products is reduced.

SUMMARY

To overcome the aforementioned limitation of the related art, the present disclosure may provide a display apparatus and a driving power control method thereof, which may control an initial voltage of a driving power, used in a gate driver, to within a target voltage range regardless of a TFT process distribution of the gate driver.

To achieve these objects and other advantages and in accordance with the purpose of the disclosure, as embodied and broadly described herein, a display apparatus comprises: a display panel including gate lines, data lines, and pixels connected to the gate lines and the data lines; a gate driver configured to drive the gate lines of the display panel, the gate driver including a plurality of gate stages that are connected to a power line that supplies an output voltage to the plurality of gate stages; and a comparator circuit coupled with the gate driver through a feedback line, the comparator circuit configured to compare a first divided voltage of a first node of the comparator circuit that is based on a feedback current in the feedback line and a second divided voltage of a second node of the comparator circuit that based on a reference voltage, and supply the output voltage to a third node of the comparator circuit that is connected to the power line, the output voltage based on the comparison between the first divided voltage and the second divided voltage.

In one embodiment, a driving power control method of a display apparatus including a gate driver driving gate lines of a display panel where the gate driver includes a plurality of gate stages that are connected to a power line that supplies an output voltage to the plurality of gate stages, the driving power control method comprising: comparing, by a comparator circuit that is coupled with the gate driver, a first divided voltage of a first node of the comparator circuit that is based on a feedback current in a feedback line that is connected to the gate driver and a second divided voltage of a second node of the comparator circuit that is based on a reference voltage; and supplying the output voltage to a third node of the comparator circuit that is connected to the power line, the output voltage based on the comparison between the first divided voltage and the second divided voltage.

In one embodiment, a display apparatus comprising: a display panel including gate lines, data lines, and pixels connected to the gate lines and the data lines; a data driver configured to provide data voltages to the data lines; a power line that supplies a source voltage; a gate driver including a plurality of gate stages having output nodes connected to the gate lines and a monitoring stage having an output node that is not connected to the gate lines, the plurality of gate stages and the monitoring stage connected to the power line and receive the source voltage from the power line; a feedback line connected to the output node of the monitoring stage; and a driving power control circuit that is connected to the feedback line, the driving power control circuit configured to output the source voltage to the power line that is connected to the monitoring stage and the plurality of gate stages based on a comparison of a first voltage that is dependent on a feedback current in the feedback line and a second voltage that is dependent on a reference voltage supplied to the driving power control circuit, wherein the driving power control circuit is further configured to adjust a voltage level of the reference voltage based on the source voltage output by the driving power control circuit being outside of a target voltage range.

The display apparatus and driving power control method thereof may control an initial voltage of a driving power, used in a gate driver, to within a target voltage range regardless of a TFT process distribution of the gate driver.

BRIEF DESCRIPTION OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure. In the drawings.

DETAILED DESCRIPTION

Figure 1:
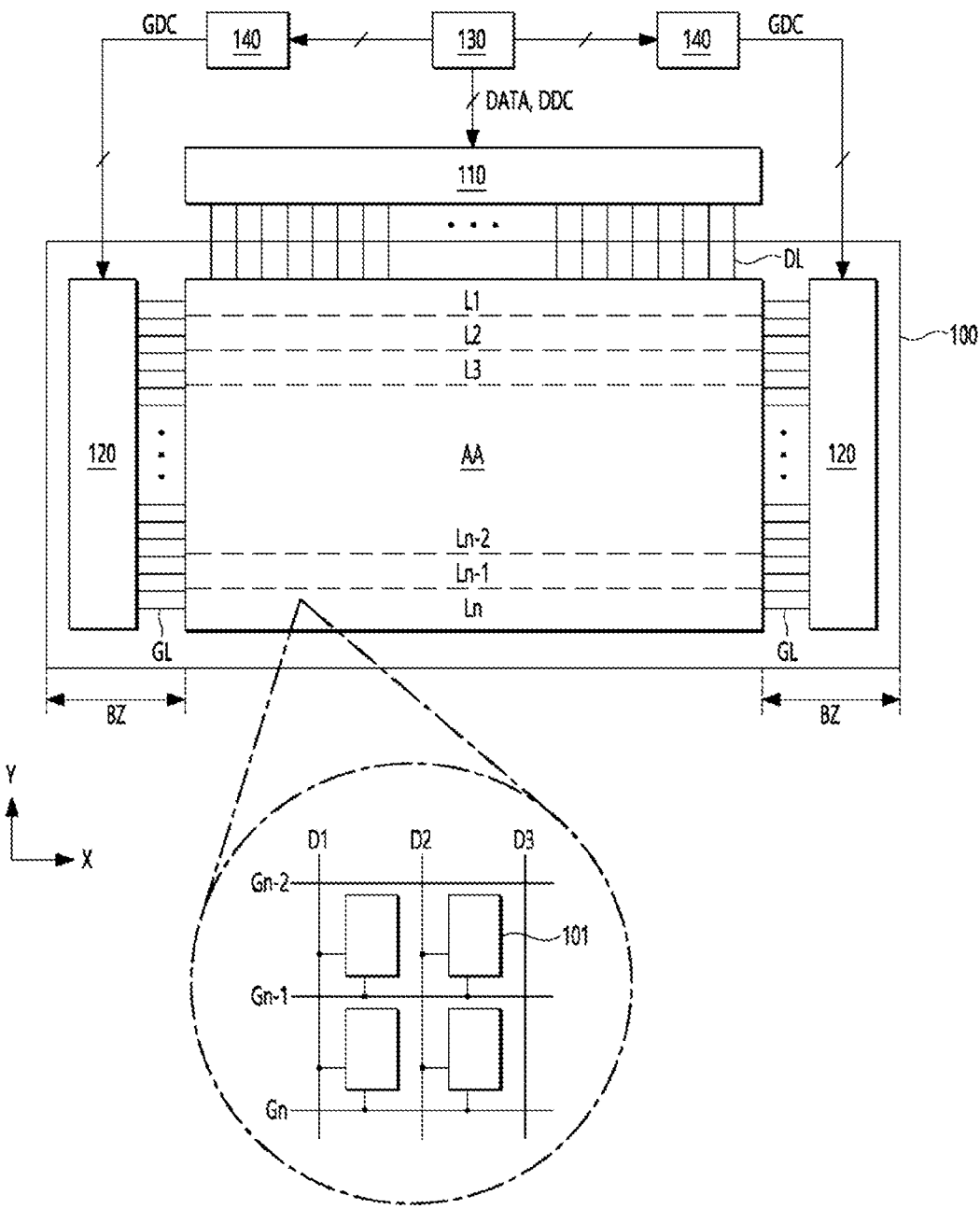
FIG. 1 is a block diagram illustrating a display apparatus according to an exemplary embodiment of the present disclosure.

Advantages and features of the present disclosure, and implementation methods thereof will be clarified through following exemplary embodiments described with reference to the accompanying drawings. The present disclosure may, however, be embodied in different forms and should not be construed as limited to the embodiments set forth herein. Rather, these exemplary embodiments are provided so that this disclosure may be sufficiently thorough and complete to assist those skilled in the art to fully understand the scope of the present disclosure. Furthermore, the present disclosure is only defined by scopes of claims.

The shapes, dimensions, areas, sizes, ratios, angles, numbers and the like disclosed in the drawings for description of various embodiments of the present disclosure are merely exemplary and the present disclosure is not limited thereto. Like reference numerals refer to like elements throughout. As used herein, the terms "comprise", "having", "containing", "constituting", "including" and the like suggest that other parts can be added unless a more limiting term "only", "merely", etc. is used. As used herein, the singular forms "a", "an", and "the" are intended to include the plural forms as well, unless context clearly indicates otherwise.

Elements in various embodiments of the present disclosure are to be interpreted as including margins of error even without explicit statements.

In describing a position relationship, for example, when a position relation between two parts is described as "on~", "over~", "above", "under~", "below", "beneath", "beside", "next to~" and the like, one or more other parts may be disposed between the two parts unless "just" or "direct" is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

In the following description, when the detailed description of the relevant known function or configuration is determined to unnecessarily obscure the important point of the present disclosure, the detailed description will be omitted. Hereinafter, embodiments of the present disclosure will be described in detail with reference to the accompanying drawings.

FIG. 1 is a block diagram illustrating a display apparatus according to an exemplary embodiment of the present disclosure.

Referring to FIG. 1, a display panel 100 may include a screen AA which displays an input image. The screen AA may include a pixel array which displays an image corresponding to pixel data (hereinafter referred to as image data) DATA of an input image. The pixel array may include a plurality of data lines DL, a plurality of gate lines GL intersecting with the data lines DL, and a plurality of pixels 101 at the intersection of the plurality of data lines DL and the plurality of gate lines GL.

The pixels 101 may be arranged as a matrix type defined by the data lines DL and the gate lines GL, in the screen AA. The pixels 101 may be arranged as various types, such as a type where pixels emitting the same light are shared, a stripe type, and a diamond type in addition to a matrix type, in the screen AA.

The pixel array may include a pixel column and a plurality of pixel lines L1 to Ln intersecting with the pixel column. The pixel column may include pixels which are arranged in a y-axis direction, which may be a vertical direction, without being limited thereto. The pixel line may include pixels which are arranged in an x-axis direction, which may be a horizontal direction, without being limited thereto. One vertical period may be one frame period which is needed for writing image data DATA of one frame in all pixels of a screen. One horizontal period may be a time obtained by dividing one frame period by the number of pixel lines L1 to Ln. One horizontal period may be a time which is needed for writing image data DATA of one pixel line in pixels of one pixel line.

The pixels 101 may include a red (R) pixel, a green (G) pixel, and a blue (B) pixel 101 so as to implement colors. The pixels 101 may further include a white (W) pixel. Needless to say, the pixels 101 may include other colors such as cyan, magenta, yellow, black, etc.

Each of the pixels 101 may include a driving element, which generates a driving current corresponding to a gray level of the image data DATA, and a light emitting device where the amount of light is controlled based on a level of the driving current. The R pixel may include a red light emitting device, the G pixel may include a green light emitting device, the B pixel may include a blue light emitting device, and the W pixel may include a white light emitting device.

A plurality of pixels 101 may configure one unit pixel for implementing various colors. For example, based on an extension direction of the gate line GL or an extension direction of the data line DL, four pixels (for example, R, G, B, and W pixels) arranged adjacent to one another may configure one unit pixel.

In FIG. 1, in the circled part, "D1 to D3" may be data lines, and "Gn-2 to Gn" may be gate lines. Each of the pixels 101 of FIG. 1 may include the same pixel circuit. The pixel circuit may include a driving element, one or more switch elements, and one or more capacitors.

Touch sensors may be disposed in the display panel 100. The touch sensors may be disposed as an on-cell type or an add-on type in the screen AA of the display panel 100, or may be implemented as in-cell type touch sensors embedded in the pixel array. In the add-on type, a display device and a touch sensor module including the touch sensors are separately manufactured and then the touch sensor module is attached to an upper substrate of the display device. In the on-cell type, elements constituting the touch sensors are formed directly on the surface of the upper substrate of a display device. In the in-cell type, elements constituting the touch sensors are mounted inside the display device to thereby achieve a thin profile and increase the durability of the display device. A touch input may be sensed through the touch sensors, or may be sensed through only the pixels 101 even without the touch sensors.

The display panel driver may include a source driver 110 and a gate driver 120. The display panel driver may write the image data DATA in the pixels 101 of the display panel 100, based on control by a timing controller 130.

The source driver 110 may convert the image data DATA, received from the timing controller 130, into a gamma compensation voltage by using a digital-to-analog converter (DAC) to generate data voltages. The source driver 110 may supply the data voltages to the data lines DL. The data voltage may be supplied to each of the data lines DL and may be applied to a driving element through the switch element of each pixel 101. The source driver 110 may be implemented with one or more source drive integrated circuits (ICs). The source drive IC may further include an external compensation sensing circuit for sensing a driving characteristic value of the driving element and/or the light emitting device of each pixel 101. The source drive IC may further include a touch driver which generates a touch sensor driving signal and converts an electric charge amount variation of the touch sensor into touch raw data. The source drive integrated circuits can be connected to a bonding pad of the display panel 100 by a tape automated bonding (TAB) method, a chip-on-glass (COG) method or chip on panel (COP) method. Alternatively, the source drive IC can be directly disposed on the display panel 100. Alternatively, the source drive IC can be integrated and arranged on the display panel 100. Alternatively, the source drive IC can be implemented by a chip-on-film COF method. In this case, the source driver IC can be mounted on a film connected to the display panel 100, and can be electrically connected to the display panel 100 through wires on the film.

The gate driver 120 may be provided in a bezel region BZ, which does not display an image, outside a screen in the display panel 100. The gate driver 120 may sequentially supply the gate lines GL with a gate signal synchronized with the data voltage, based on control by the timing controller 130. The gate signal may simultaneously activate pixel lines Ln-2 to Ln into which data voltages are charged. The gate driver 120 may include a plurality of gate stages, output the gate signal, and sequentially or non-sequentially shift the gate signal. The gate signal may include one or more scan signals and an emission control signal. The gate driver may be connected to a bonding pad of the display panel 100 by a tape automated bonding (TAB) method or a chip-on-glass (COG) method. Alternatively, each gate driver may be implemented as a gate-in-panel (GIP) type and disposed directly on the display panel 100. Alternatively, the gate driver may be integrated and disposed on the display panel 100 in some cases. Alternatively, the gate driver may be implemented in a chip-on-film (COF) method to be mounted on a film connected to the display panel 100.

The timing controller 130 may receive the image data DATA and a timing signal, synchronized with the image data DATA, from a host system (not shown). The timing signal may include a vertical synchronization signal Vsync, a horizontal synchronization signal Hsync, a clock signal DCLK, a data enable signal DE and the like. The vertical synchronization signal Vsync may define a vertical period (i.e., one frame period). The horizontal synchronization signal Hsync may define a horizontal period. The data enable signal DE may define a time for which the image data DATA is transferred in the vertical period or the horizontal period. In a method of counting the data enable signal DE, the vertical period and the horizontal period may be known, and thus, the vertical synchronization signal Vsync and the horizontal synchronization signal Hsync may be omitted.

The timing controller 130 may receive, from the host system, digital video data DATA of an input image and a timing signal synchronized with the digital video data and may generate a source timing control signal DDC for controlling an operation timing of the data driver 110 and a gate timing control signal GDC for controlling an operation timing of the gate driver 120, based on the timing signal (for example, Vsync, Hsync, and DE) received from the host system.

The timing controller 130 may multiply an input frame frequency by i (where i is a natural number of more than 0) to control an operation timing of each of the source driver 110 and the gate driver 120 with "input frame frequency xi Hz". The input frame frequency may be about 60 Hz in national television standards committee (NTSC) and may be about 50 Hz in phase-alternating line (PAL).

The host system be one of a television (TV), a tablet computer, a notebook computer, a set-top box, a navigation system, a personal computer (PC), a home theater system, a mobile device, a wearable device, and an automotive display system. In mobile devices and wearable devices, the source driver 110, the timing controller 130, and a level shifter may be integrated into one IC. The host system may scale the image signal from a video source to fit the resolution of the display panel 100, and may transmit it to the timing controller 130 together with the timing signal.

The level shifter 140 may level-shift a logic on/off voltage of the gate timing control signal GDC, output from the timing controller 130, to a gate on voltage and a gate off voltage and may supply the gate on voltage or the gate off voltage to the gate driver 120. The logic off voltage of the gate timing control signal GDC may be converted into the gate off voltage, and the logic on voltage of the gate timing control signal GDC may be converted into the gate on voltage. The gate timing control signal may include a start pulse, a shift clock, a reset signal, an initialization signal, and the like.

The timing controller 130 may transfer the image data DATA to the source driver 110 through an internal interface circuit. The internal interface circuit may be implemented as an embedded clock point to point interface (EPI), a low voltage differential signaling (LVDS) interface, a serial peripheral interface (SPI), and the like, but is not limited thereto.

Figure 2:
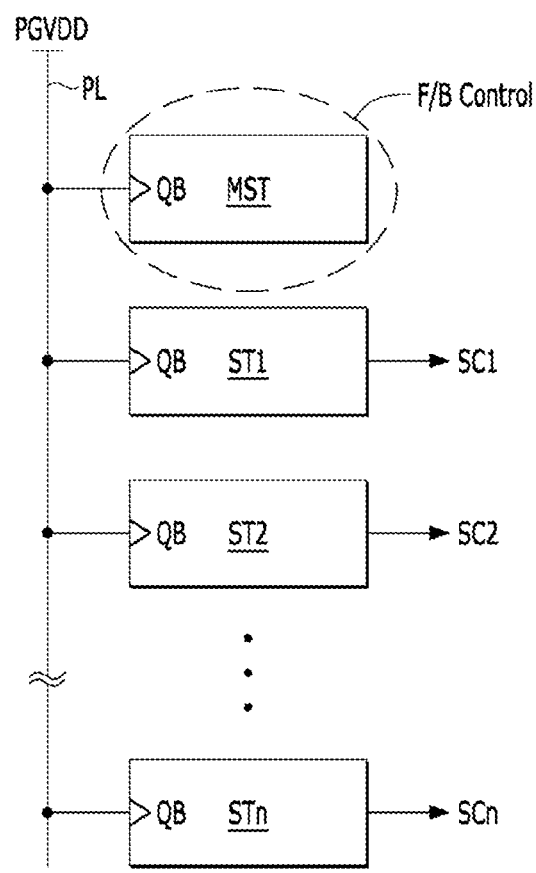
FIG. 2 is a diagram schematically illustrating a configuration of a gate driver according to an exemplary embodiment of the present disclosure.

FIG. 2 is a diagram schematically illustrating a configuration of a gate driver 120 according to an exemplary embodiment of the present disclosure.

Referring to FIG. 2, the gate driver 120 may include a plurality of gate stages ST1 to STn and at least one monitoring stage MST, which are formed by the same TFT process as the display panel. Output nodes of the gate stages ST1 to STn may be connected with the gate lines of the display panel, and an output node of the monitoring stage MST may not be connected with the gate lines of the display panel. The gate stages ST1 to STn may generate gate signals SC1 to SCn and may supply the gate signals SC1 to SCn to the gate lines of the display panel. The output node of the monitoring stage MST may be connected with the driving power control circuit for controlling a high-level source voltage PGVDD through a feedback line. The monitoring stage MST may be used for a feedback control operation in the driving power control circuit and may be disposed at an uppermost end of the gate stages ST1 to STn or may be disposed at a lowermost end of the gate stages ST1 to STn.

The gate stages ST1 to STn and the monitoring stage MST may be connected with the same high level power line PL and may receive the high-level source voltage PGVDD through the high-level power line PL.

Each of the gate stages ST1 to STn and the monitoring stage MST may include a Q node (see FIG. 3) and a QB node, which operate to be opposite to each other. That is, the Q node has a voltage level and the QB node has a voltage level that is opposite the voltage level of the Q node. When the Q node is activated, the QB node may be deactivated, and on the contrary, when the QB node is activated, the Q node may be deactivated.

A gate electrode of a pull-up transistor may be connected with the Q node, and a gate electrode of a pull-down transistor may be connected with the QB node. The pull-up transistor and the pull-down transistor may be serially connected with an output node. A drain electrode of the pull-up transistor may be connected with an input terminal of a shift clock, and a source electrode of the pull-up transistor may be connected with the output node. A drain electrode of the pull-down transistor may be connected with the output node, and a low-level source voltage may be input to a source electrode of the pull-down transistor.

A period where the QB node is activated to the high-level source voltage PGVDD may be far longer than a period where the Q node is activated, in one frame period. Therefore, the amount of degradation in the pull-down transistor where the gate electrode is connected with the QB node may be greater than the amount of degradation in the pull-up transistor. When the pull-down transistor is degraded, the gate signals SC1 to SCn output from the gate stages ST1 to STn may be distorted, and thus, it may be difficult to normally secure a charge timing of a pixel.

To decrease a degradation in the pull-down transistor, an initial setting value of the high-level source voltage PGVDD applied to the QB nodes of the gate stages ST1 to STn in common may be designed not to be outside a predetermined target voltage range.

In the related art, due to a TFT process distribution of the gate driver, it may be difficult to manage the high-level source voltage PGVDD within the target voltage range.

Therefore, the driving power control circuit according to the present embodiment may control a comparator output on the basis of a level of a feedback current flowing in the monitoring stage MST and may further vary a reference voltage of the comparator based on a sensing result of the comparator output, and thus, an initial setting value of the high level source voltage PGVDD may be easily controlled to within the target voltage range regardless of the TFT process distribution of the gate driver.

Figure 3:
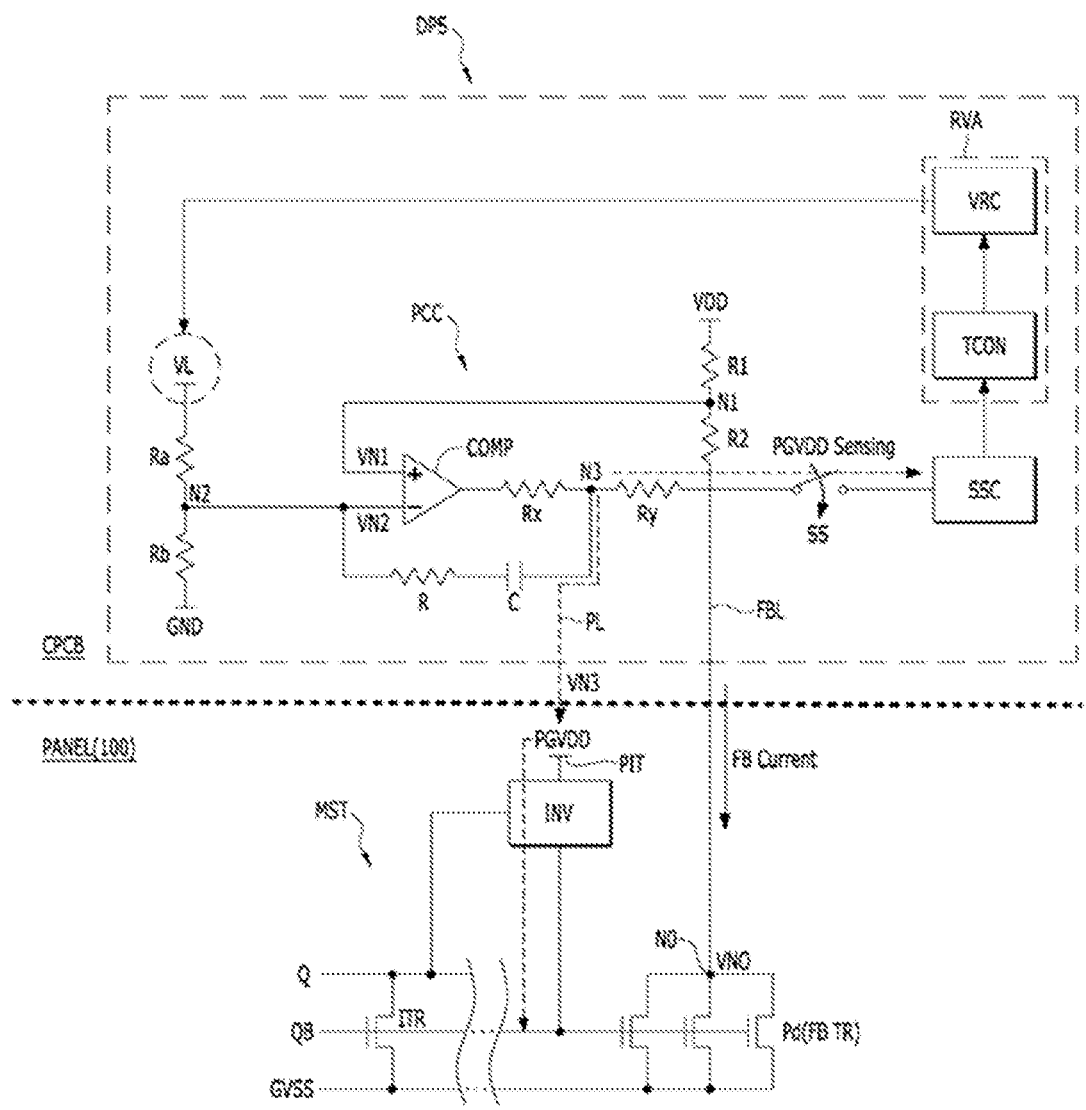
FIG. 3 is a diagram illustrating a configuration of each of a monitoring stage of a gate driver and a driving power control circuit connected thereto, according to an exemplary embodiment of the present embodiment.

FIG. 3 is a diagram illustrating a configuration of each of monitoring stage MST of a gate driver and a driving power control circuit connected thereto, according to an exemplary embodiment of the present embodiment.

Referring to FIG. 3, the monitoring stage MST according to the present embodiment may be provided in a non-display area of a display panel 100. The monitoring stage MST may include a QB node, a pull-down transistor Pd where an output operation is controlled by a voltage of the QB node, a power input terminal PIT to which a high-level source voltage PGVDD is input, and an inverter circuit INV which controls an electrical connection between the QB node and the power input terminal PIT.

The power input terminal PIT may receive the high-level source voltage PGVDD from a driving power control circuit DPS through a high-level power line PL. The high-level source voltage PGVDD may be an output voltage of a third node N3 of a comparator circuit PCC included in the driving power control circuit DPS.

While a Q node is being deactivated, an inverter circuit INV may electrically connect the power input terminal PIT with the QB node to allow the high-level source voltage PGVDD to be supplied to the QB node. The inverter circuit INV may release (e.g., disconnect) an electrical connection between the power input terminal PIT and the QB node while the Q node is being activated. The inverter circuit INV may be implemented as a connection configuration between a plurality of transistors.

The pull-down transistor Pd may be implemented with one or more feedback transistors FB TR connected between an output node NO and an input terminal of a low-level source voltage GVSS. A gate electrode of the pull-down transistor Pd may be connected with the QB node, a drain electrode thereof may be connected with a feedback line FBL through the output node NO, and a source electrode thereof may be connected with the input terminal of the low-level source voltage GVSS.

While the QB node is being activated, the monitoring stage MST may further include an input transistor ITR which electrically connects the Q node with the input terminal of the low-level source voltage GVSS. In the monitoring stage MST, elements (for example, a pull-up transistor) which are not directly associated with the present disclosure are not shown. However, in one embodiment at least one pull-up transistor is connected to the Q node.

Referring to FIG. 3, the driving power control circuit DPS may include a comparator circuit PCC, a sensing circuit SSC, and a reference voltage variation circuit RVA. The driving power control circuit DPS may be mounted on a control printed circuit board (PCB) CPCB, but is not limited thereto.

The comparator circuit PCC may be connected with power input terminals PIT of all stages, including the monitoring stage MST, through the high-level power line PL in common. The comparator circuit PCC may be connected with the output node NO of the monitoring stage MST through the feedback line FBL.

The comparator circuit PCC may compare a second divided voltage VN2 of a second node N2 that is dependent on a reference voltage VL supplied to the driving power control circuit DPS with a first divided voltage VN1 of a first node N1 that is dependent on a feedback current (FB current) flowing in the feedback line FBL and may supply an output voltage VN3 of a third node N3, based on a comparison result between the first divided voltage VN1 and the second divided voltage VN2, to the high level power line PL. In one embodiment, the first divided voltage VN1 is input to a positive (+) input terminal (e.g., a first input terminal) of the comparator COMP and the second divided voltage VN2 is input to a negative (−) input terminal (e.g., a second input terminal) of the comparator COMP.

The comparator circuit PCC may be connected with the monitoring stage MST of stages of the gate driver through the feedback line FBL.

In one embodiment, the comparator circuit PCC may include a comparator COMP, a first resistor string R1 and R2 that generates the first divided voltage VN1, a second resistor string Ra and Rb that generates the second divided voltage VN2, a third resistor string Rx and Ry, and a feedback unit including a feedback resistor R and a feedback capacitor C.

A positive (+) input terminal of the comparator COMP may be connected with the first resistor string R1 and R2.

The first resistor string R1 and R2 may include a first resistor R1 and a second resistor R2, which are serially connected with the first node N1 of the feedback line FBL. The positive (+) input terminal of the comparator COMP may receive the first divided voltage VN1 from the first node N1.

A negative (−) input terminal of the comparator COMP may be connected with the second resistor string Ra and Rb. The second resistor string Ra and Rb may include a third resistor Ra and a fourth resistor Rb, which are serially connected with the second node N2 disposed between a ground voltage source GND and an input terminal of a reference voltage VL. The negative (−) input terminal of the comparator COMP may receive the second divided voltage VN2 from the second node N2.

An output terminal of the comparator COMP may be connected with the third resistor string Rx and Ry. The third resistor string Rx and Ry may include a fifth resistor Rx and a sixth resistor Ry, which are serially connected with the third node N3.

The feedback unit R and C of the comparator COMP may include a feedback resistor R and a feedback capacitor C, which are serially connected between the negative (−) input terminal and the output terminal of the comparator COMP.

The comparator COMP may compare the first divided voltage VN1 with the second divided voltage VN2 to generate the output voltage VN3 of the third node N3.

The output voltage VN3 of the third node N3 may be controlled by a repetitive feedback operation in the comparator circuit PCC until the first divided voltage VN1 is equal to the second divided voltage VN2.

The repetitive feedback operation will be briefly described below.

In a first feedback operation, when a feedback current flowing in the feedback line FBL is low (e.g., a first magnitude), the first divided voltage VN1 may be high (e.g., a first voltage level). When the first divided voltage VN1 is high, the output voltage VN3 of the third node N3 may be high (e.g., a first output voltage level). When the output voltage VN3 of the third node N3 is high, a gate-source voltage of the pull-down transistor Pd may increase, and thus, the feedback current flowing in the feedback line FBL may increase.

In a second feedback operation, when the feedback current flowing in the feedback line FBL increases, the first divided voltage VN1 may decrease (e.g., a second voltage level that is less than the first voltage level). When the first divided voltage VN1 is lower than the first divided voltage VN1 in the first feedback operation, the output voltage VN3 of the third node N3 may decrease from the first output voltage level to a second output voltage level that is less than the first output voltage level. When the output voltage VN3 of the third node N3 is lower than the output voltage VN3 in the first feedback operation, the gate-source voltage of the pull-down transistor Pd may decrease, and thus, the feedback current flowing in the feedback line FBL may decrease compared to the current in the feedback line FBL during the first feedback operation.

Referring to FIG. 3, the sensing circuit SSC may be connected with the third node N3 of the third resistor string Rx and Ry through a sensing control switch SS.

The sensing control switch SS may be turned on during a period where the output voltage VN3 of the third node N3 is sensed, and in another period, the sensing control switch SS may be turned off.

The sensing circuit SSC may be activated while the sensing control switch SS being turned on and may sense the output voltage VN3 of the third node N3. The sensing circuit SSC may include a voltage sampling circuit and an analog-to-digital converter, for example. The sensing circuit SSC may be replaced with an external compensation sensing circuit. In this case, the sensing circuit SSC may be integrated into a source drive integrated circuit (IC) instead of the control PCB CPCB.

Referring to FIG. 3, the reference voltage variation circuit RVA may control a level of the reference voltage VL, based on a sensing result of the output voltage VN3 of the third node N3, and may include a timing controller TCON and a voltage controller VRC.

The timing controller TCON may receive the sensing result of the output voltage VN3 of the third node N3 from the sensing circuit SSC. The timing controller TCON may determine whether the sensing result satisfies the predetermined target voltage range.

Responsive to determining that the sensing result satisfies the target voltage range as a result of the determination, the timing controller TCON may deactivate an operation of the voltage controller VRC. On the other hand, responsive to determining that the sensing result does not satisfy the target voltage range as a result of the determination, the timing controller TCON may activate an operation of the voltage controller VRC and may output a first voltage control signal and a second voltage control signal, which are for shifting the output voltage VN3 of the third node N3, to within the target voltage range.

Responsive to the output voltage VN3 of the third node N3 being greater than the target voltage range, the timing controller TCON may output the first voltage control signal, and responsive to the output voltage VN3 of the third node N3 being less than the target voltage range, the timing controller TCON may output the second voltage control signal.

The voltage controller VRC may increase a level of the reference voltage VL in response to the first voltage control signal from the timing controller TCON, and thus, may lower a level of the output voltage VN3 of the third node N3 to within the target voltage range.

The voltage controller VRC may decrease a level of the reference voltage VL in response to the second voltage control signal from the timing controller TCON, and thus, may increase a level of the output voltage VN3 of the third node N3 to within the target voltage range.

Figure 4:
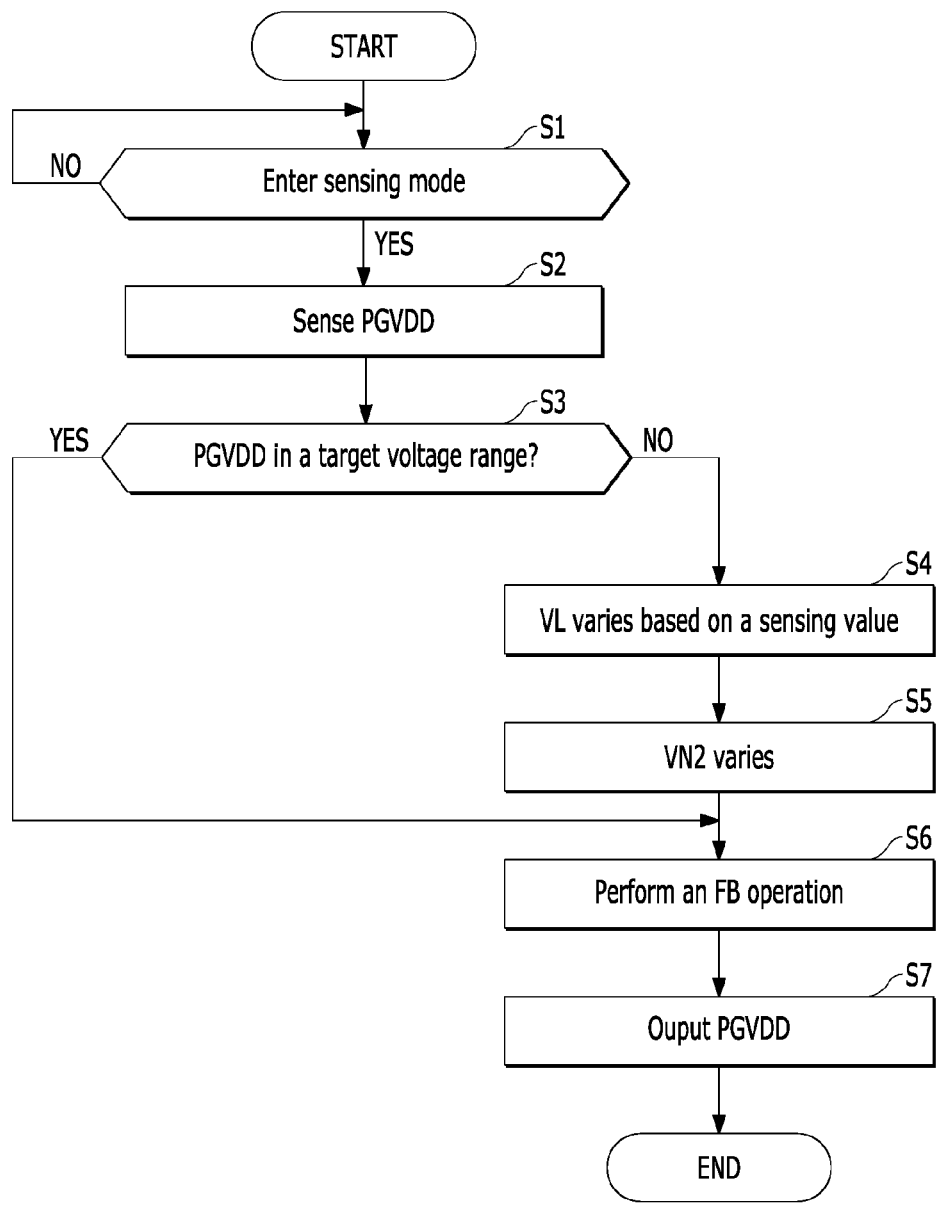
FIG. 4 is a block diagram illustrating a driving power control method of a display apparatus according to an exemplary embodiment of the present disclosure.

FIG. 4 is a block diagram illustrating a driving power control method of a display apparatus according to an exemplary embodiment of the present disclosure.

Referring to FIG. 4, in a driving power control method of a display apparatus according to the present embodiment, responsive to a sensing mode being activated, a comparator circuit connected with the monitoring stage MST through a feedback line may compare a second divided voltage of a second node with a first divided voltage of a first node based on a feedback current flowing in the feedback line and may supply an output voltage (for example, PGVDD) of a third node, based on a comparison result between the first divided voltage and the second divided voltage, to a high level power line (S1).

In the driving power control method of the display apparatus according to the present embodiment, a sensing circuit may sense the output voltage PGVDD of the third node (S2).

In the driving power control method of the display apparatus according to the present embodiment, a reference voltage variation circuit may determine whether the output voltage PGVDD of the third node satisfies a target voltage range (S3).

In the driving power control method of the display apparatus according to the present embodiment, when the output voltage PGVDD of the third node does not satisfy the target voltage range, the reference voltage variation circuit may control a level of the reference voltage VL on the basis of a sensing value to control a level of the second divided voltage VN2 input to a negative (−) input terminal of a comparator (S4 and S5). The driving power control method of the display apparatus according to the present embodiment may control a level of the reference voltage VL so that the sensed output voltage PGVDD of the third node satisfies the target voltage range.

Responsive to the sensed output voltage PGVDD of the third node being greater than the target voltage range, the driving power control method of the display apparatus according to the present embodiment may increase a level of the reference voltage VL to lower a level of the output voltage PGVDD of the third node to within the target voltage range.

Responsive to the sensed output voltage PGVDD of the third node being less than the target voltage range, the driving power control method of the display apparatus according to the present embodiment may reduce a level of the reference voltage VL to increase a level of the output voltage PGVDD of the third node to within the target voltage range.

In the driving power control method of the display apparatus according to the present embodiment, when the output voltage PGVDD of the third node satisfies the target voltage range, a reference voltage variation operation (S4 and S5) described above may be omitted.

The driving power control method of the display apparatus according to the present embodiment described above may perform a repetitive feedback operation until the first divided voltage VN1 is equal to the second divided voltage VN2, and thus, may set the output voltage VN3 of the third node N3 (S6 and S7).

Figure 5:
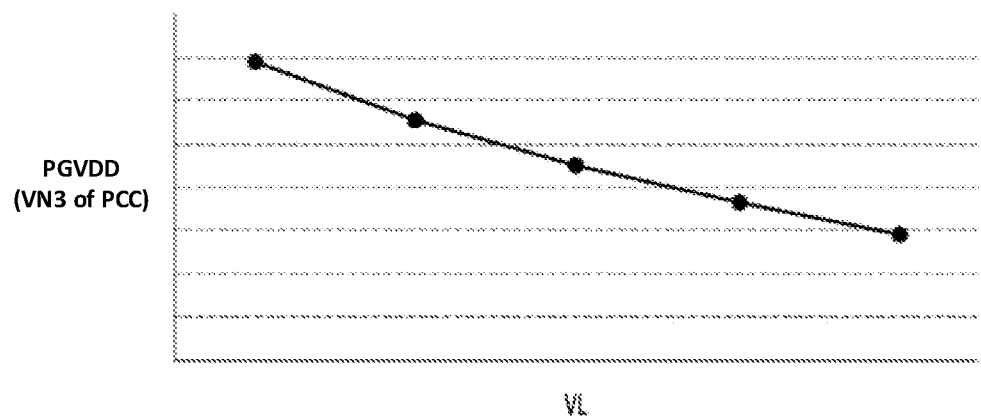
FIG. 5 is a diagram illustrating an output voltage (i.e., a high-level source voltage) level of a third node corresponding to a level of a reference voltage according to an exemplary embodiment of the present disclosure.
Figure 6:
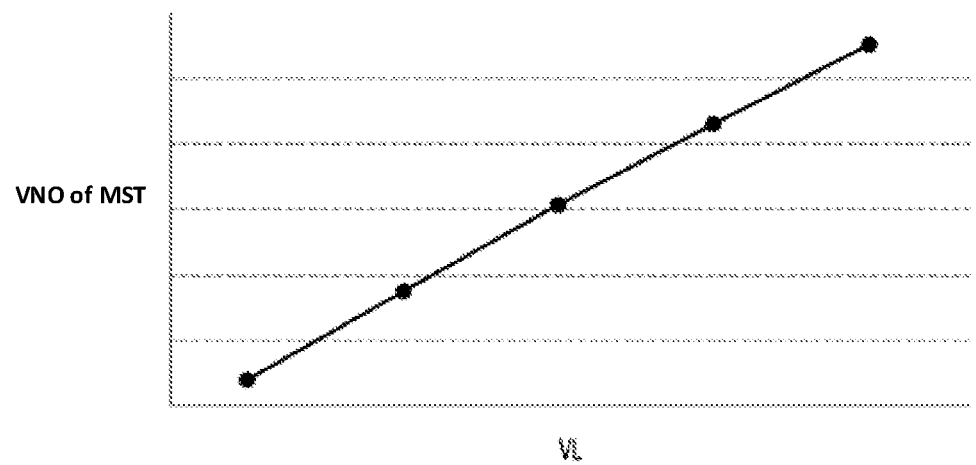
FIG. 6 is a diagram illustrating a voltage level of an output node of a monitoring stage corresponding to a level of a reference voltage according to an exemplary embodiment of the present disclosure.
Figure 7:
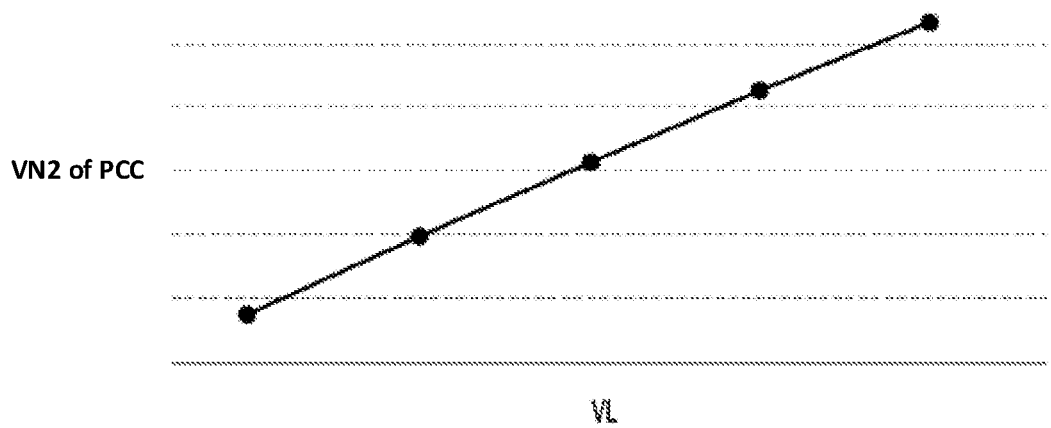
FIG. 7 is a diagram illustrating an output voltage level of a second node corresponding to a level of a reference voltage according to an exemplary embodiment of the present disclosure.

FIG. 5 is a diagram illustrating an output voltage (i.e., a high-level source voltage) level of a third node corresponding to a level of a reference voltage according to an exemplary embodiment of the present disclosure. FIG. 6 is a diagram illustrating a voltage level of an output node of a monitoring stage corresponding to a level of a reference voltage according to an exemplary embodiment of the present disclosure. FIG. 7 is a diagram illustrating an output voltage level of a second node corresponding to a level of a reference voltage according to an exemplary embodiment of the present disclosure.

Referring to FIG. 5, in the comparator circuit PCC, a level of the reference voltage VL and a level of the output voltage (for example, PGVDD) of the third node VN3 may have an inversely proportional relationship therebetween. That is, when the reference voltage VL is controlled to increase, the output voltage (for example, PGVDD) of the third node VN3 may decrease, and when the reference voltage VL is controlled to decrease, the output voltage (for example, PGVDD) of the third node VN3 may increase.

Referring to FIG. 6, a level of the reference voltage VL of the comparator circuit PCC and a level of an output node voltage VNO of the monitoring stage MST may have a proportional relationship therebetween. That is, when the reference voltage VL is increased the output node voltage VNO of the monitoring stage MST may increase, and when the reference voltage VL is decreased, the output node voltage VNO of the monitoring stage MST may decrease.

Referring to FIG. 7, in the comparator circuit PCC, a level of the reference voltage VL and a level of the second divided voltage VN2 may have a proportional relationship therebetween. That is, when the reference voltage VL increases, the second divided voltage VN2 may increase, and when the reference voltage VL decreases, the second divided voltage VN2 may decrease.

Figure 8A:
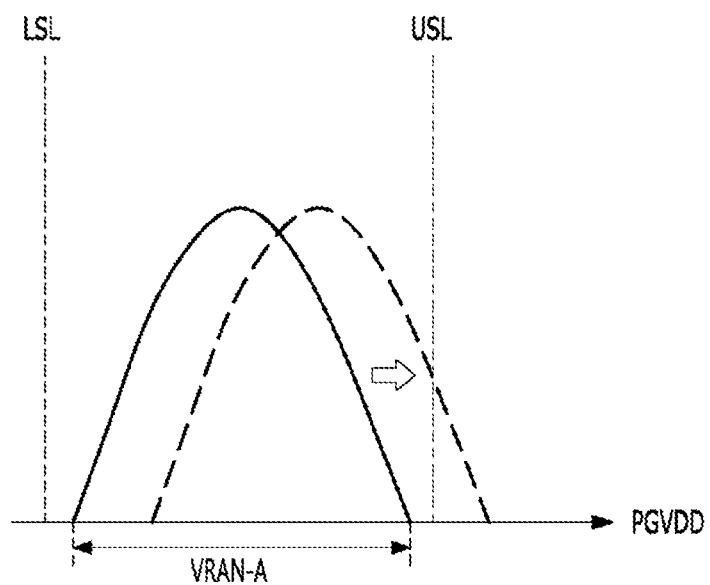
FIG. 8A is a diagram illustrating an example where a defect occurs because a distribution range of an initial voltage setting value of a driving power is wide according to an exemplary embodiment of the present disclosure.
Figure 8B:
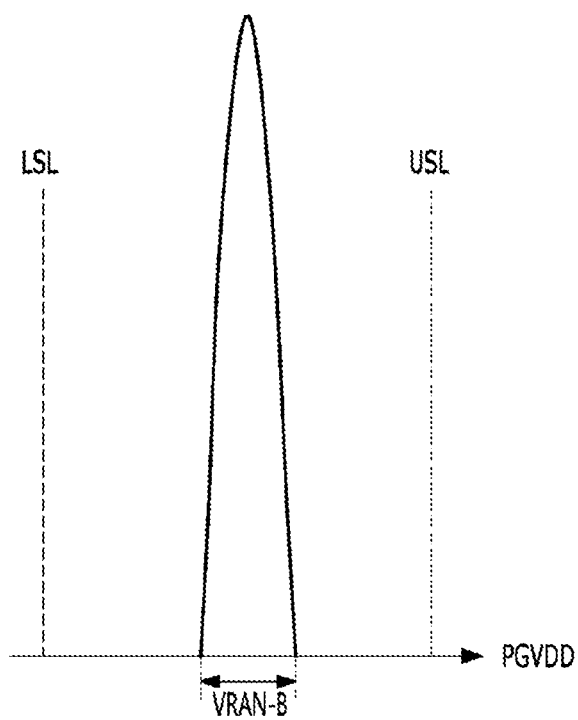
FIG. 8B is a diagram illustrating an example where an initial voltage setting value of a driving power is set to within a target voltage range, based on the control of a level of a reference voltage according to an exemplary embodiment of the present disclosure.

FIG. 8A is a diagram illustrating an example where a defect occurs because a distribution range of an initial voltage setting value of a driving power is wide according to an exemplary embodiment of the present disclosure. FIG. 8B is a diagram illustrating an example where an initial voltage setting value of a driving power is set to within a target voltage range, based on the control of a level of a reference voltage according to an exemplary embodiment of the present disclosure.

In FIGS. 8A and 8B, LSL represents a lower limit voltage of a target voltage range, and USL represents an upper limit voltage of the target voltage range.

In a case where a distribution range VRAN-A of an initial voltage setting value of a driving power is wide, when a level of a reference voltage is not additionally controlled, as in FIG. 8A, the initial voltage setting value may be outside USL. In this case, the reliability and lifetime of a gate driver may decrease, and a yield rate of products may be reduced.

On the other hand, as in the present embodiment, when a level of the reference voltage is additionally controlled, the initial voltage setting value may not be outside the target voltage range LSL to USL, and thus, the reliability of the gate driver and a yield rate of products may be enhanced.

The present embodiment may realize the following effects.

In the present embodiment, a comparator output may be controlled based on a level of a feedback current flowing in a monitoring stage and a comparator reference voltage may vary further based on a sensing result of the comparator output, and thus, an initial voltage of a high-level source voltage may be easily controlled to within a target voltage range regardless of a TFT process distribution of a gate driver.

The effects according to the present disclosure are not limited to the above examples, and other various effects may be included in the specification.

While the present disclosure has been particularly shown and described with reference to exemplary embodiments thereof, it will be understood by those of ordinary skill in the art that various changes in form and details may be made therein without departing from the spirit and scope of the present disclosure as defined by the following claims.

What is claimed is:

1. A display apparatus comprising:
   a display panel including gate lines, data lines, and pixels connected to the gate lines and the data lines;
   a gate driver configured to drive the gate lines of the display panel, the gate driver including a plurality of gate stages that are connected to a power line that supplies an output voltage to the plurality of gate stages; and
   a comparator circuit coupled with the gate driver through a feedback line, the comparator circuit configured to compare a first divided voltage of a first node of the comparator circuit that is based on a feedback current in the feedback line and a second divided voltage of a second node of the comparator circuit that is based on a reference voltage, and supply the output voltage to a third node of the comparator circuit that is connected to the power line, the output voltage based on the comparison between the first divided voltage and the second divided voltage, wherein the gate driver further comprises at least one monitoring stage that is connected to the power line,
wherein the at least one monitoring stage comprises:
- a Q node having a voltage level;
- a QB node having a voltage level that is opposite the voltage level of the Q node;
- a power input terminal connected to the power line, the power input terminal configured to receive the output voltage of the third node as a first source voltage through the power line;
- an inverter circuit configured to couple the power input terminal with the QB node and supply the first source voltage to the QB node while the power input terminal is coupled with the QB node and while the Q node is deactivated; and
- at least one pull-down transistor including a gate electrode coupled with the QB node, a drain electrode coupled with the feedback line at an output node of the at least one monitoring stage, and a source electrode that receives a second source voltage.

2. The display apparatus of claim 1, further comprising:
a sensing circuit configured to sense the output voltage of the third node; and
a reference voltage variation circuit coupled to the sensing circuit, the reference voltage variation circuit configured to control a voltage level of the reference voltage based on the sensed output voltage of the third node.

3. The display apparatus of claim 2, wherein the voltage level of the reference voltage is controlled by the reference voltage variation circuit such that the sensed output voltage of the third node satisfies a target voltage range.

4. The display apparatus of claim 3, wherein responsive to the sensed output voltage of the third node being greater than the target voltage range, the reference voltage variation circuit increases the voltage level of the reference voltage such that a voltage level of the output voltage of the third node is reduced to be within the target voltage range, and responsive to the sensed output voltage of the third node being less than the target voltage range, the reference voltage variation circuit reduces the voltage level of the reference voltage such that the voltage level of the output voltage of the third node is increased to be within the target voltage range.

5. The display apparatus of claim 1, wherein responsive to the feedback current having a first magnitude, the first divided voltage at the first node has a first voltage level such that the output voltage at the third node has a first output voltage level that causes the feedback current to increase, and responsive to the feedback current having a second magnitude that is greater than the first magnitude, the first divided voltage at the first node has a second voltage level that is less than the first voltage level such that the output voltage at the third node has a second output voltage level that is less than the first output voltage level that causes the feedback current to decrease.

6. The display apparatus of claim 1,
wherein the comparator circuit is coupled with the at least one monitoring stage through the feedback line without the comparator circuit being coupled to the plurality of gate stages, and the comparator circuit is coupled with the at least one monitoring stage and the plurality of gate stages through the power line.

7. The display apparatus of claim 6, wherein an output node of each gate stage from the plurality of gate stages is connected with a corresponding gate line of the gate lines, and an output node of the at least one monitoring stage is connected to the feedback line without being connected with the gate lines.

8. The display apparatus of claim 1, wherein the comparator circuit comprises:
a first resistor and a second resistor connected to the feedback line, the first node between the first resistor and the second resistor; and
a third resistor that receives the reference voltage and a fourth resistor that receives a ground voltage, the second node between the third resistor and the fourth resistor.

9. A driving power control method of a display apparatus including a gate driver driving gate lines of a display panel where the gate driver includes a plurality of gate stages that are connected to a power line that supplies an output voltage to the plurality of gate stages and a monitoring stage having an output node that is not connected to the gate lines, the driving power control method comprising:
comparing, by a comparator circuit that is coupled with the gate driver, a first divided voltage of a first node of the comparator circuit that is based on a feedback current in a feedback line that is connected to the gate driver and a second divided voltage of a second node of the comparator circuit that is based on a reference voltage; and
supplying the output voltage to a third node of the comparator circuit that is connected to the power line, the output voltage based on the comparison between the first divided voltage and the second divided voltage,
wherein the monitoring stage comprises:
- a Q node having a voltage level;
- a QB node having a voltage level that is opposite the voltage level of the Q node;
- a power input terminal connected to the power line, the power input terminal configured to receive the output voltage of the third node as a first source voltage through the power line;
- an inverter circuit configured to couple the power input terminal with the QB node and supply the first source voltage to the QB node while the power input terminal is coupled with the QB node and while the Q node is deactivated; and
- at least one pull-down transistor including a gate electrode coupled with the QB node, a drain electrode coupled with the feedback line at an output node of the monitoring stage, and a source electrode that receives a second source voltage.

10. The driving power control method of claim 9, further comprising:
sensing, by a sensing circuit, the output voltage of the third node of the comparator circuit; and
controlling, by a reference voltage variation circuit that is coupled to the sensing circuit, a voltage level of the reference voltage based on the sensed output voltage of the third node.

11. The driving power control method of claim 9, wherein responsive to the feedback current having a first magnitude, the first divided voltage at the first node has a first voltage level such that the output voltage at the third node has a first output voltage level that causes the feedback current to increase, and responsive to the feedback current having a second magnitude that is greater than the first magnitude, the first divided voltage at the first node has a second voltage level that is less than the first voltage level such that the output voltage at the third node has a second output voltage level that is less than the first output voltage level that causes the feedback current to decrease.

12. The driving power control method of claim 10, wherein controlling the voltage level of the reference voltage comprises controlling the voltage level of the reference voltage such that the sensed output voltage of the third node satisfies a target voltage range.

13. The driving power control method of claim 12, wherein controlling the voltage level of the reference voltage comprises:
responsive to the sensed output voltage of the third node being greater than the target voltage range, increasing the voltage level of the reference voltage such that a voltage level of the output voltage of the third node is reduced to be within the target voltage range; and
responsive to the sensed output voltage of the third node being less than the target voltage range, reducing the voltage level of the reference voltage such that the voltage level of the output voltage of the third node is increased to be within the target voltage range.

14. A display apparatus comprising:
a display panel including gate lines, data lines, and pixels connected to the gate lines and the data lines;
a data driver configured to provide data voltages to the data lines;
a power line that supplies a source voltage;
a gate driver including a plurality of gate stages having output nodes connected to the gate lines and a monitoring stage having an output node that is not connected to the gate lines, the plurality of gate stages and the monitoring stage connected to the power line and receive the source voltage from the power line;
a feedback line connected to the output node of the monitoring stage; and
a driving power control circuit that is connected to the feedback line, the driving power control circuit configured to output the source voltage to the power line that is connected to the monitoring stage and the plurality of gate stages based on a comparison of a first voltage that is dependent on a feedback current in the feedback line and a second voltage that is dependent on a reference voltage supplied to the driving power control circuit,
wherein the driving power control circuit is further configured to adjust a voltage level of the reference voltage based on the source voltage output by the driving power control circuit being outside of a target voltage range,
wherein the monitoring stage comprises:
a Q node having a voltage level;
a QB node having a voltage level that is opposite the voltage level of the Q node;
a power input terminal connected to the power line, the power input terminal configured to receive the source voltage from the driving power control circuit through the power line; and
an inverter circuit configured to couple the power input terminal with the QB node and supply the source voltage to the QB node while the power input terminal is coupled with the QB node and while the Q node is deactivated; and
at least one pull-down transistor including a gate electrode coupled with the QB node, a drain electrode coupled with the feedback line at the output node of the monitoring stage, and a source electrode that receives another source voltage that is different from the source voltage.

15. The display apparatus of claim 14, wherein the driving power control circuit further comprises:
a sensing circuit configured to sense the source voltage output by the driving power control circuit; and
a reference voltage variation circuit coupled to the sensing circuit, the reference voltage variation circuit configured to control the voltage level of the reference voltage based on the sensed source voltage.

16. The display apparatus of claim 15, wherein the reference voltage variation circuit is configured to increase the voltage level of the reference voltage responsive to the source voltage being greater than the target voltage range, and decrease the voltage level of the reference voltage responsive to the source voltage being less than the target voltage range.

17. The display apparatus of claim 14, wherein the driving power control circuit comprises:
a comparator including a first input terminal and a second input terminal, the first input terminal connected to a first node to which the first voltage is supplied and the second input terminal connected to a second node to which the second voltage is supplied;
a first resistor and a second resistor connected to the feedback line, the first node between the first resistor and the second resistor, and the feedback line connected to the second resistor; and
a third resistor that receives the reference voltage and a fourth resistor that receives a ground voltage, the second node between the third resistor and the fourth resistor.

18. The display apparatus of claim 17, wherein responsive to the feedback current having a first magnitude, the first voltage at the first node has a first voltage level such that the source voltage has a first output voltage level that causes the feedback current to increase, and responsive to the feedback current having a second magnitude that is greater than the first magnitude, the first voltage at the first node has a second voltage level that is less than the first voltage level such that the source voltage has a second output voltage level that is less than the first output voltage level that causes the feedback current to decrease.

* * * * *